(12) United States Patent
Fujii et al.

(10) Patent No.: US 10,145,905 B2
(45) Date of Patent: Dec. 4, 2018

(54) GAS CELL SEALING METHOD

(71) Applicant: SEIKO EPSON CORPORATION, Tokyo (JP)

(72) Inventors: Eiichi Fujii, Shiojiri (JP); Kimio Nagasaka, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 441 days.

(21) Appl. No.: 14/805,834

(22) Filed: Jul. 22, 2015

(65) Prior Publication Data

US 2016/0023401 A1 Jan. 28, 2016

(30) Foreign Application Priority Data

Jul. 24, 2014 (JP) ................................ 2014-150716

(51) Int. Cl.
| | | |
|---|---|---|
| *B29C 65/16* | (2006.01) | |
| *G01R 33/032* | (2006.01) | |
| *G01R 33/00* | (2006.01) | |
| *B23K 26/06* | (2014.01) | |
| *B23K 26/20* | (2014.01) | |
| *B23K 26/324* | (2014.01) | |
| *B23K 103/00* | (2006.01) | |

(52) U.S. Cl.
CPC ........ *G01R 33/032* (2013.01); *B23K 26/0648* (2013.01); *B23K 26/0652* (2013.01); *B23K 26/206* (2013.01); *B23K 26/324* (2013.01); *G01R 33/0052* (2013.01); *B23K 2103/54* (2018.08)

(58) Field of Classification Search
CPC ............ B23K 23/0648; B23K 23/0652; B23K 23/206; B23K 23/324
See application file for complete search history.

(56) References Cited

U.S. PATENT DOCUMENTS

| | | | | |
|---|---|---|---|---|
| 2001/0027633 A1* | 10/2001 | Amako | .................. | B65B 51/22 53/478 |
| 2007/0295719 A1* | 12/2007 | Yamazaki | ........... | B29C 65/1635 220/4.01 |
| 2008/0261065 A1* | 10/2008 | Fujimoto | ............ | B29C 65/1635 428/543 |
| 2013/0025793 A1* | 1/2013 | Le Monnier | ........ | B29C 65/1635 156/379.6 |
| 2013/0047417 A1* | 2/2013 | Nagasaka | .......... | G01R 33/0076 29/592.1 |

(Continued)

FOREIGN PATENT DOCUMENTS

| | | |
|---|---|---|
| JP | 2002137939 A | 5/2002 |
| JP | 2009-104841 A | 5/2009 |

(Continued)

*Primary Examiner* — Daniel McNally
(74) *Attorney, Agent, or Firm* — Oliff PLC

(57) ABSTRACT

A gas cell sealing method includes bonding step in which a bonding portion of a gas cell main body having an opening and a lid for closing the opening where a sealant for bonding the gas cell main body and the lid is provided is heated by converging a laser beam from a laser light source through an optical element, and the lid is bonded to the gas cell main body by applying pressure in a direction that presses the lid against the gas cell main body, the pressure being applied while the laser beam is being converged to the bonding portion.

7 Claims, 5 Drawing Sheets

(56) References Cited

U.S. PATENT DOCUMENTS

2014/0063757 A1   3/2014   Takagi

FOREIGN PATENT DOCUMENTS

| JP | 4665260 B2 | 4/2011 |
| JP | 2013-172811 A | 9/2013 |
| JP | 2014-049700 A | 3/2014 |
| JP | 2014-113603 A | 6/2014 |

* cited by examiner

GAS CELL SEALING METHOD

BACKGROUND

1. Technical Field

The present invention relates to a gas cell sealing method.

2. Related Art

Techniques are known that seal an electronic component package or a semiconductor package. For example, JP-A-2002-137939 describes melting a sealing member under a predetermined temperature distribution created on a glass member surface by forming an irradiation power distribution with optical heating means. Japanese Patent No. 4665260 describes a glass substrate sealing system that includes a laser process assembly that forms an airtight sealing portion by heat melting a sealing material disposed along a plurality of display packages disposed between glass substrates, a transfer assembly that supplies glass substrates to a work table disposed underneath the laser process assembly, and a buffer assembly that retains glass substrates in a manner allowing glass substrates to be continuously supplied to the work table via the transfer assembly. The work table has temporary position alignment means that temporarily aligns the glass substrates being placed in position by the transfer assembly, a precision alignment means that consequently aligns the glass substrates, and a plurality of jet orifices through which air is jetted in a direction opposite the irradiation direction of a beam from the laser process assembly.

An optical pumping magnetic sensor is a known example of a biomagnetic measurement device that detects a magnetic field produced by an organism such as in the heart. The optical pumping magnetic sensor uses gas cells filled with alkali metal gas. One way of sealing such a gas cell is to seal the opening of the gas cell with a lid. In sealing a gas cell by bonding the gas cell main body and a lid with a sealant, the bonding heat applied to the sealant may put a thermal load on the gas cell or on the gas inside the gas cell. The techniques described in the foregoing publications apply heat over a relatively wide area. While this enables sealing a wide area, high-precision sealing of a minute area cannot be achieved with these techniques.

SUMMARY

An advantage of some aspects of the invention is to improve the sealing precision of gas cells without having a thermal load applied to the gas cell main body or to the gas inside gas cells.

An aspect of the invention provides a method for sealing a gas cell. The method is for sealing an opening of the gas cell, and includes: converging a laser beam with a laser beam-converging optical element to a sealant that bonds the gas cell to a lid used to seal the opening; and bonding the gas cell and the lid to each other by applying pressure in a direction that presses the lid and the gas cell. The sealing method enables improving the gas cell sealing precision without having a thermal load applied to the gas cell main body or to the gas inside the gas cell.

In a preferred aspect of the invention, the pressure is exerted by applying pressure with the optical element. According to the method for sealing a gas cell, the sealing member that seals the gas cell can be provided in a simpler configuration than when pressure is not applied with the optical element.

In another preferred aspect of the invention, the load point of the applied pressure occurs within the opening. According to the method for sealing a gas cell, pressure can be more evenly applied to the lid than when the load point does not occur within the opening, and the sealing precision can improve.

In still another preferred aspect of the invention, the gas cell and the lid are bonded to each other in a vacuum state. According to the method for sealing a gas cell, the vacuum sealing improves the gas cell sealing precision.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. First Embodiment (1) Configuration

Figure 1:
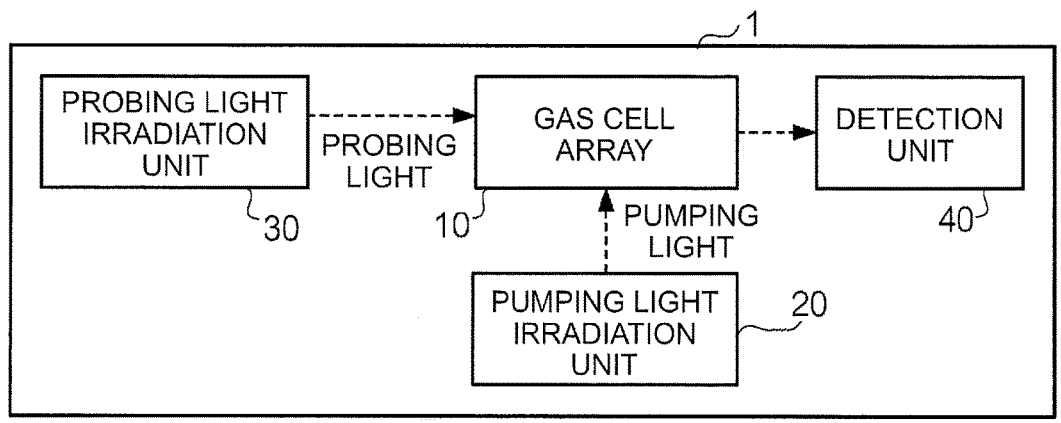
FIG. 1 is a block diagram representing a configuration of a magnetic measurement device.

FIG. 1 is a block diagram representing a configuration of a magnetic measurement device 1 according an embodiment. The magnetic measurement device 1 is a biometric device that measures biological conditions based on a measured index obtained by measuring magnetic fields produced by an organism, for example, such as a magnetic field produced by the heart (cardiac magnetic field) or the brain (cerebral magnetic field). The magnetic measurement device 1 includes a gas cell array 10, a pumping light irradiation unit 20, a probing light irradiation unit 30, and a detection unit 40. The gas cell array 10 has a plurality of gas cells. Each gas cell is filled with an alkali metal gas (for example, cesium (Cs)). The pumping light irradiation unit 20 outputs pumping light that interacts with the alkali metal atoms (for example, light of 894 nm wavelength corresponding to the D1 line of cesium. The pumping light has a circularly polarized light component. Irradiation of pumping light excites electrons in the outermost shell of the alkali metal atoms, and causes spin polarization. The spin polarized alkali metal atoms undergo precessional movement under the magnetic field B produced by the measurement target. The spin polarization of single alkali metal atoms relaxes over time. However, because the pumping light is CW (Continuous Wave) light, the generation and relaxation of spin polarization repeats itself both concurrently and continuously. The spin polarization, therefore, is constant when viewed as a population of atoms as a whole.

The probing light irradiation unit 30 outputs probing light having a linearly polarized light component. The polarization plane of the probing light rotates because of the Faraday effect before and after the passage of probing light through the gas cells. The rotational angle of the polarization plane varies as a function of magnetic field B. The detection unit 40 detects the rotational angle of probing light. The detection unit 40 includes a photodetector that outputs signals according to the quantity of incident light, a processor that processes the signals, and a memory that stores data. The processor calculates the magnitude of magnetic field B by using the output signals from the photodetector. The processor writes data indicative of the calculation result in the memory. A user can then obtain information of the magnetic field B produced by the measurement target.

Figure 2:
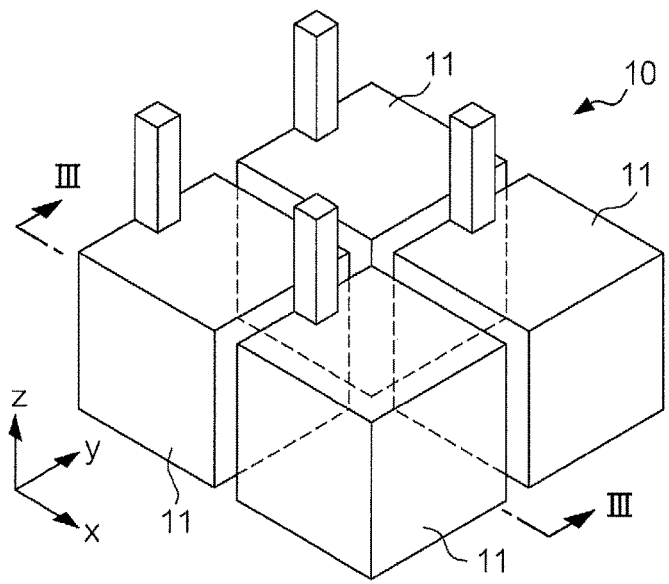
FIG. 2 shows an external view of a gas cell array.

FIG. 2 is an external view of the gas cell array 10. In this example, the gas cell array 10 has a plurality (2×2) of gas cells 11 that is two-dimensionally disposed on x-y plane.

Figure 3:
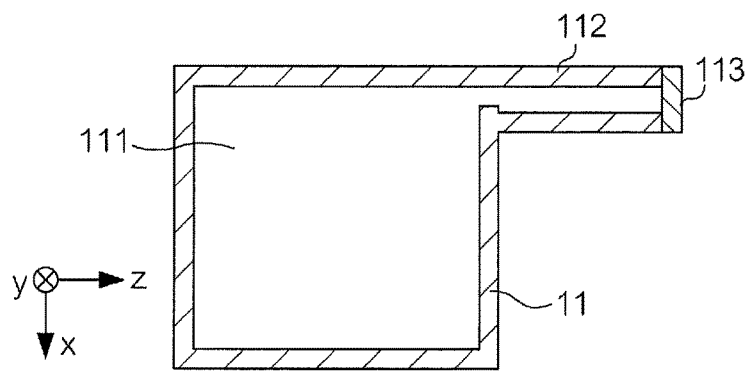
FIG. 3 is a cross sectional view of a gas cell.

FIG. 3 is a cross sectional view of one of the gas cells 11 forming the gas cell array 10, taken at III-III. The cross section is parallel to x-z plane. The gas cells 11 are cuboid cells (boxes) to be filled with alkali metal gas. The gas cells 11 are formed by using light transmissive materials such as fused quartz and borosilicate glass. The gas cells 11 are produced by using, for example, glass molding. The gas cells 11 may be formed by processing glass. Each gas cell 11 has a main chamber 111 to be filled with alkali metal gas. The main chamber 111 opens to outside through an exhaust pipe 112. The exhaust pipe 112 is tubular in shape. One end of the exhaust pipe 112 is connected to a vacuum pump (not illustrated), and the main chamber 111 is evacuated or, as required, filled with alkali metal gas through the exhaust pipe 112.

The opening of the exhaust pipe 112 is sealed with a lid 113. The lid 113 is made of the same material (for example, fused quartz) used for the main body of the gas cell 11. The lid 113 has a sealant applied thereto at a position opposite the portion of the exhaust pipe 112 surrounding the pipe opening of the gas cell 11. The sealant bonds the lid 113 to the gas cell main body, and seals the gas cell 11. Preferably, the surface of the lid 113 bonded to the exhaust pipe 112 has a rough texture, or a pearskin finish as it is often called, to improve the strength of bonding with the sealant. In this example, the sealant is a glass frit having a lower melting point than the glass used as the material of the main body of the gas cells 11.

(2) Producing Process

Figure 4:
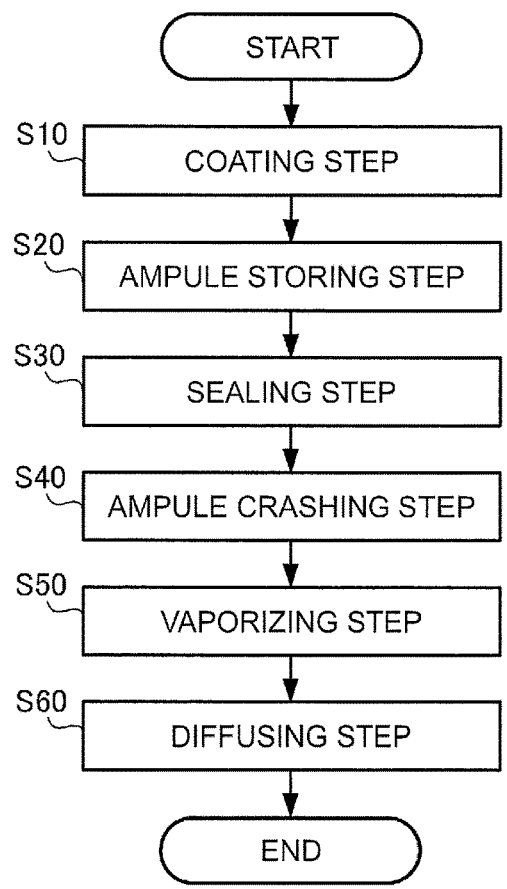
FIG. 4 is a flowchart of gas cell producing steps.

FIG. 4 is a flowchart representing the steps for producing the gas cells 11.

A coating layer is formed on the inner walls of the gas cell 11 in step S10 (coating step). For example, paraffin is used for the coating layer. The coating layer is applied by using a dry process or a wet process.

An ampule is stored in the gas cell 11 in step S20 (ampule storing step). The ampule is filled with an alkali metal solid.

The gas cell 11 is sealed in step S30 (sealing step). The gas cell 11 is sealed in a vacuum heating environment.

Figure 5:
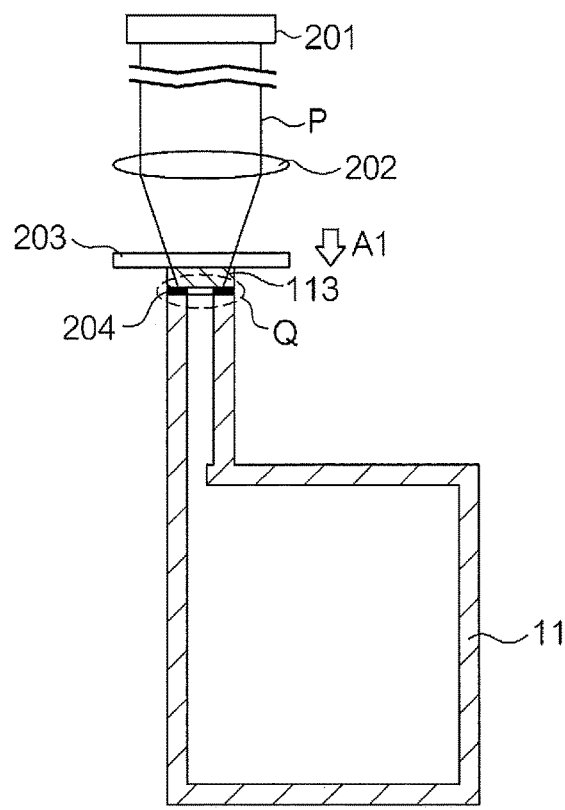
FIG. 5 is a diagram representing a gas cell sealing method according to First Embodiment.

FIG. 5 is a diagram representing a method for sealing the gas cell 11. In the example represented in FIG. 5, the gas cell 11 is sealed by using a laser light source 201, a lens 202, and a pressurization substrate 203. The laser light source 201 produces a laser beam P that irradiates and heats the bonding portion of the lid 113 and the main body of the gas cell 11. The lens 202 is an optical element that converges the irradiation laser beam P from the laser light source 201. At the bonding portion Q of the lid 113 and the main body of the gas cell 11 is a sealant 204 applied in a ring form in a portion surrounding the opening of the gas cell 11. Here, the sealant 204 may be one that forms a bond at a relatively high temperature. The lid 113 is disposed over the bonding portion Q of the gas cell 11. The pressurization substrate 203 for applying pressure to the sealant 204 is disposed on the lid 113. The laser light source 201 and the lens 202 are positioned so that the laser beam converges on the bonding portion Q through the lens 202.

The pressurization substrate 203 is a pressure applying member that applies pressure in a direction that presses the lid 113 against the main body of the gas cell 11. In this example, the pressurization substrate 203 is a transparent substrate that passes the laser beam. The laser beam converged through the lens 202 irradiates the bonding portion Q through the pressurization substrate 203. The irradiation of the laser beam locally heats the bonding portion Q. While the laser beam is being converged to the bonding portion Q, the pressurization substrate 203 applies pressure in a direction that presses the lid 113 against the main body of the gas cell 11 (the direction of arrow A1 in FIG. 5). The sealant 204 flattens under the load applied while being heated, and bonds the lid 113 to the main body of the gas cell 11.

Referring back to FIG. 4, the ampule is crashed in step S40 (ampule crashing step). Specifically, the ampule is irradiated with a laser beam with a focal point set on the ampule, and a hole is formed through the ampule.

The alkali metal solid in the ampule vaporizes in step S50 (vaporizing step). Specifically, the alkali metal solid is heated to vaporize by heating the gas cell 11.

The alkali metal gas is diffused in step S60 (diffusing step). Specifically, the alkali metal gas is diffused by being maintained for a certain length of time at a certain temperature (desirably at a temperature above room temperature).

The low-melting-point glass frit used as the sealant to bond the lid with the main body of the gas cell allows for use of low processing temperatures. This is advantageous in reducing the effect of heat against the gas and the gas cell. However, low-melting-point glass frits typically have poor chemical resistance, and are susceptible to corrosion by the highly reducing gas component inside the gas cell. Such corrosion may break the seal.

The present inventors studied the durability of gas cell sealing portions formed with low-melting-point glass frits by using a technique of related art. The seal remained intact before aging. However, alteration was observed at the inner contact portion after aging (100° C.×24 h), and the seal was completely broken after it was left unattended for 1 year at ordinary temperature.

Low-melting-point glass frits with high chemical resistance tend to involve relatively high bonding temperatures. Heating a frit of high bonding temperature on a stage such as a hot plate exerts a thermal load on the gas or the gas cell. When heat is applied using a hot plate in a vacuum, there will be no temperature transfer unless there is a surface load. Surface load is thus necessary in such heating. However, frit bonding may fail in portions of the minute lid when the lid is pushed even slightly in oblique direction with a highly flat substrate, and moves the load point out of the frit ring.

In the embodiment, however, a laser beam is converged to locally heat the bonding portion of the lid 113 and the main body of the gas cell 11, and pressure is applied to the lid 113 while applying heat. This makes it possible to form a seal that is not easily breakable, without affecting the gas or the gas cell.

In the embodiment, the local heating of the bonding portion also enables increasing the sealing temperature, and allows for use of sealants of high chemical resistance. This improves the precision of sealing.

2. Second Embodiment

Figure 6:
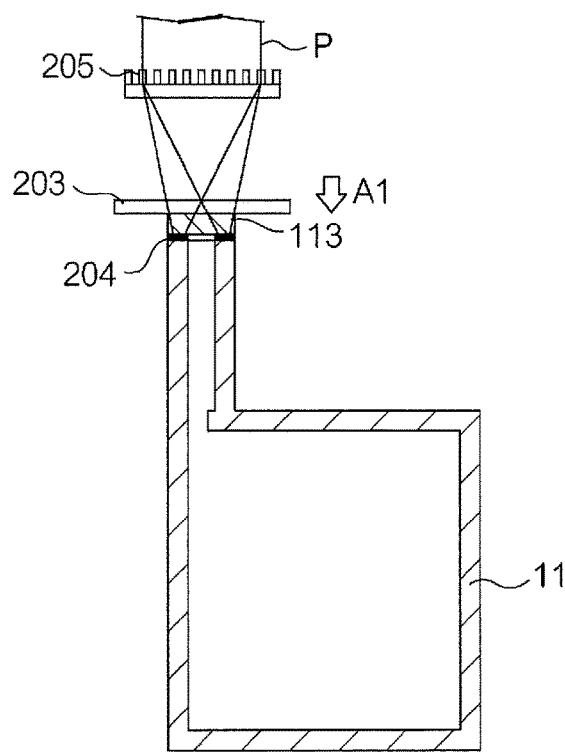
FIG. 6 is a diagram representing a gas cell sealing method according to Second Embodiment.

FIG. 6 is a diagram representing a method for sealing the gas cells 11 according to Second Embodiment. In contrast to First Embodiment in which the lens 202 is used as the optical element that converges a laser beam, Second Embodiment uses an optical element 205 in place of the lens 202. The optical element 205 is an optical element that controls a laser beam for more efficient and selective irradiation than in First Embodiment. The optical element 205 forms a beam intensity distribution of a shape that conforms to the disposition of the sealant 204. For example, when the sealant 204 is disposed in a ring-like fashion around the opening, the optical element 205 controls the beam intensity distribution in such a way as to conform to the ring-like disposition of the sealant.

The optical element 205 has a converging function to converge a laser beam, and a ring-forming function to form a ring-like laser beam intensity distribution. Here, the specific phase pattern φ(r) of the optical element 205 can be represented by the following formula (1).

$$\phi(r) = \text{MOD}\,[(\phi1(r)+\phi2(r)), 2\pi] \quad (1)$$

In the formula, φ1(r) represents the phase distribution of the optical element concerning the converging function, and φ2(r) represents the phase distribution of the optical element concerning the ring-forming function. The phase function of the optical element 205 is expressed as the sum of the phase functions φ1(r) and φ2(r), with the phase being wrapped around at 2π.

This embodiment does not require a complex optical system, and the optical element 205 alone can produce an intensity distribution that conforms to the disposition of the sealant, making it possible to selectively irradiate a laser beam at high efficiency.

3. Third Embodiment

Figure 7:
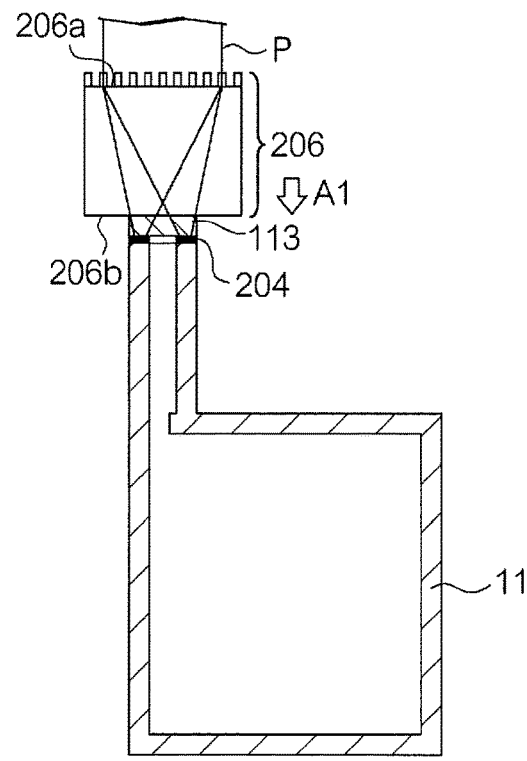
FIG. 7 is a diagram representing a gas cell sealing method according to Third Embodiment.

FIG. 7 is a diagram representing a method for sealing the gas cells 11 according to Third Embodiment, analogous to FIG. 5 of First Embodiment. In First Embodiment, the lens 202 (optical element) and the pressurization substrate 203 are configured as separate members. In contrast, Third Embodiment uses a pressurization substrate 206 provided as an integral unit of an optical element and a pressurization substrate. An optical element (for example, diffraction grating) that controls a laser beam is disposed on the surface 206a of the pressurization substrate 206. The pressurization substrate 206 is pressed against the lid 113 on the surface 206b opposite the surface 206a.

In this embodiment, aberration and other such effects can be reduced by the provision of the integrally provided optical element and pressurization substrate, and a laser beam can be irradiated even more efficiency and selectively.

4. Fourth Embodiment

Figure 8:
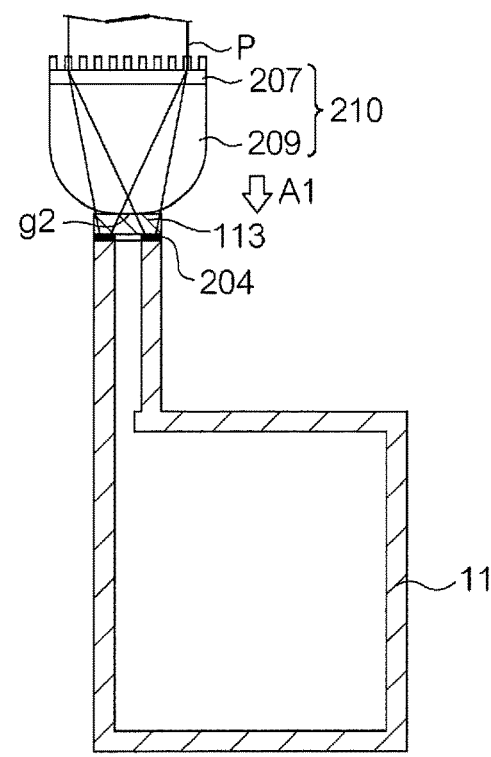
FIG. 8 is a diagram representing a gas cell sealing method according to Fourth Embodiment.

FIG. 8 is a diagram representing a method for sealing the gas cells 11 according to Fourth Embodiment. The sealing method represented in FIG. 8 differs from the sealing method of Third Embodiment in that the pressurization substrate 206 is replaced by a pressurization member 210. The pressurization member 210 is configured as a single contacted unit of an optical element 207 and a pressurization substrate 209. The optical element 207 is no different from the optical element 205 shown in FIG. 6. The pressurization substrate 209 has a curved surface on the side that is pressed against the lid 113. The pressurization substrate 209 contacts the lid 113 at a position (hereinafter, "contact position") within the ring of the sealant 204. Specifically, pressure is applied to the lid in such a manner that the load point g2 is within the ring of the sealant 204 disposed in a ring-like fashion.

When heat is applied with a hot plate in the gas cell sealing step, a surface load is necessary for the transfer of temperature to the sealant. On the other hand, the present embodiment, using a laser beam as the heat source, allows for use of a point load, provided that it occurs within of the sealant ring. With the contact position between the pressurization substrate 209 and the lid 113 occurring within the sealant 204, the embodiment enables evenly applying pressure to the minute lid 113. In this case, a mechanism that vertically applies pressure in high precision will not be necessary. With the uniform pressure application to the lid 113, the sealing precision can improve.

5. Other Embodiments

The invention is not limited to the foregoing embodiments, and may be implemented in various modifications. The following describes some variations. The following variations may be used in a combination of two or more.

(1) First Variation

In the foregoing Third Embodiment, the gas cells 11 are sealed by using the pressurization substrate 206 provided as an integral unit of an optical element and a pressurization substrate. The pressurization substrate 206, however, may be replaced with other member.

Figure 9:
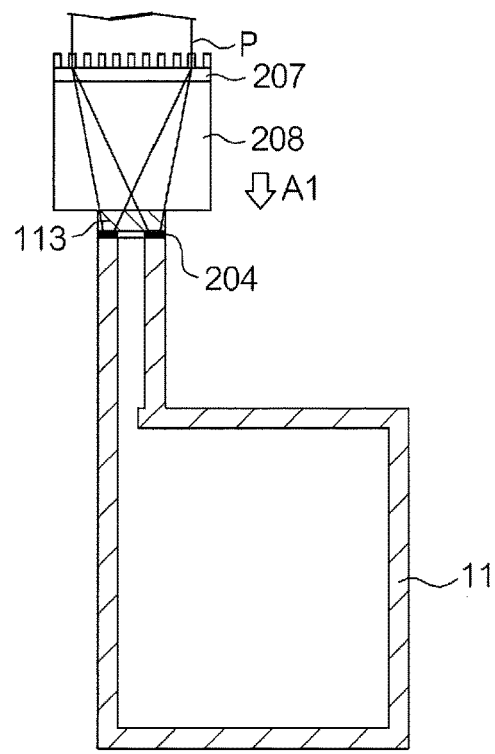
FIG. 9 is a diagram representing a gas cell sealing method according to First Variation.

FIG. 9 is a diagram representing another method for sealing the gas cells 11. In this example, the optical element 207 is separately fabricated from the pressurization substrate 208, and is integrated with the pressurization substrate 208 in contact therewith. A laser beam through the optical element 207 forms an optimum irradiation intensity distribution for the sealant, and irradiates the sealant 204. The sealant 204 becomes fused, and seals the gas cell 11 under the heat of the laser beam and the applied pressure from the pressurization substrate 208.

Because the optical element is in contact with the pressurization substrate, aberration and other such effects can be reduced, and a laser beam can be irradiated even more efficiently and selectively.

(2) Second Variation

Figure 10:
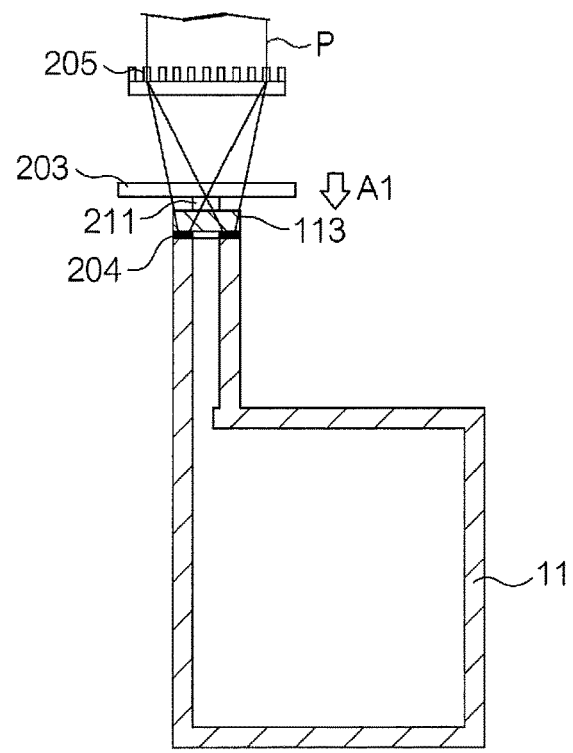
FIG. 10 is a diagram representing a gas cell sealing method according to Second Variation.

FIG. 10 is a diagram representing yet another method for sealing the gas cells 11. The sealing method illustrated in FIG. 10 differs from the sealing method of FIG. 6 in that a point pressurization member 211 is provided between the pressurization substrate 203 and the lid 113. The point pressurization member 211 is disposed within the ring of the sealant 204. Specifically, the load point of the applied pressure by the pressurization substrate 203 occurs within the ring of the sealant 204.

In this configuration, the load point occurs within the ring of the sealant 204, and the pressure can be evenly applied to the minute lid 113. This enables improving the sealing precision.

(3) Third Variation

In the foregoing embodiments and variations, an antireflective film such as a dielectric film may be provided on the surface of the pressurization substrate, the point pressurization member, or the lid to improve the efficiency of using the laser beam.

(4) Fourth Variation

The foregoing embodiments use the gas cells 11 having the main chamber 111 and the exhaust pipe 112. However, the gas cells 11 are not limited to the shape described above. For example, a gas cell may be used that does not have the exhaust pipe 112. In this case, an opening is provided for the main chamber filled with alkali metal gas, and is sealed with the lid.

(5) Fifth Variation

The gas cell producing method is not limited to the method illustrated in FIG. 4. The steps shown in FIG. 4 may include additional steps. The steps may be performed in different order, or some of the steps may be omitted. For example, the coating step may be omitted.

(6) Sixth Variation

The gas cell is not limited to the shape described in the foregoing embodiments. The foregoing embodiments described the example in which the gas cell has a cuboid shape. However, the gas cell may have a tetrahedral shape other than cuboid, or may have a curved surface in its shape, such as in a cylinder. For example, the gas cell may have a reservoir (metal reservoir) that stores alkali metal solid when the temperature drops below the temperature that solidifies alkali metal atoms. The alkali metal only needs to be gasified at least at the time of measurement, and does not need to be in a gas state at all times.

(7) Seventh Variation

The specifics of the ampule crashing step are not limited to what was described in the foregoing embodiments. The ampule may have a portion where two materials with different coefficients of thermal expansion are attached to each other. In this case, the ampule (or the whole gas cell storing the ampule) is heated in the ampule crashing step, instead of being irradiated with a laser beam. For heating, a heat sufficient to crash the ampule with the different coefficients of thermal expansion is applied. The ampule also may be crashed against the inner wall of the main chamber 111 under applied mechanical impact or vibration.

As another example, the sealing step may be performed with an inert gas (buffer gas) such as a noble gas filling the gas cells filled with the alkali metal gas. In other words, the gas cells 11 may be sealed in an inert gas atmosphere.

(8) Eighth Variation

The foregoing embodiments and variations described the case where alkali metal atoms are introduced into the gas cell in a solid state. However, the state of the alkali metal atoms introduced into the gas cell is not limited to solid. Alkali metal atoms may be introduced into the gas cell in any state: solid, liquid, or gas. The ampule may be replaced by a capsule.

For the coating step, an ampule with an installed coating material therein may be placed in the gas cell prior to sealing. The ampule may then be crashed by laser irradiation or the like after the sealing, and coated by vapor phase deposition.

(9) Ninth Variation

Use of the gas cells 11 is not limited to magnetic sensor applications. For example, the gas cells 11 may be used for atomic oscillators.

The invention is applicable to a wide range of fields, provided that such applications do not exceed the scope of the gist of the invention.

The entire disclosure of Japanese Patent Application No. 2014-150716, filed Jul. 24, 2015 is expressly incorporated by reference herein.

What is claimed is:

1. A method for sealing an opening of a gas cell comprising:
    disposing a pressurization member between a laser-beam optical element and a lid used to seal the opening, wherein the pressurization member has a width greater than a width of the opening,
    converging a laser beam with the laser beam-converging optical element to a sealant that bonds the gas cell to the lid, wherein the pressurization member is transparent with respect to the laser beam, the laser beam passing through the pressurization member in being converged to the sealant; and
    bonding the gas cell and the lid to each other by applying pressure via the pressurization member by disposing the pressurization member such that, in plan view, a load point applied to the lid is positioned inward of the sealant disposed around the opening, in a direction that presses the lid and the gas cell.

2. The method according to claim 1, wherein the method further comprises
    disposing a transparent member between the optical element and the pressurization member.

3. The method according to claim 2, wherein the gas cell and the lid are bonded to each other in a vacuum state.

4. The method according to claim 1, wherein a surface of the pressurization member at a side at which pressure is applied to the lid is curved.

5. The method according to claim 4, wherein the gas cell and the lid are bonded to each other in a vacuum state.

6. The method according to claim 1, wherein the gas cell and the lid are bonded to each other in a vacuum state.

7. The method according to claim 1, wherein the optical element has a phase pattern $\phi(r)$ represented by the following formula (1):

$$\phi(r)=\mathrm{MOD}\,[(\phi 1(r)+\phi 2(r)),2\pi] \quad (1),$$

wherein $\phi 1(r)$ represents the phase distribution of the optical element concerning a converging function, and $\phi 2(r)$ represents the phase distribution of the optical element concerning a ring-forming function.

* * * * *